United States Patent [19]

Saito et al.

[11] Patent Number: 4,590,442
[45] Date of Patent: May 20, 1986

[54] VARIABLE HIGH FREQUENCY OSCILLATOR

[75] Inventors: Shigeki Saito, Yokohama; Shuuji Urabe, Yokosuka, both of Japan

[73] Assignee: Nippon Telegraph & Telephone Corporation, Tokyo, Japan

[21] Appl. No.: 557,132
[22] PCT Filed: May 25, 1983
[86] PCT No.: PCT/JP83/00159
 § 371 Date: Nov. 18, 1983
 § 102(e) Date: Nov. 18, 1983
[87] PCT Pub. No.: WO83/04350
 PCT Pub. Date: Dec. 8, 1983

[30] Foreign Application Priority Data

May 25, 1982 [JP] Japan .................................. 57-87221
May 24, 1983 [JP] Japan .................................. 58-90071

[51] Int. Cl.$^4$ ................ H03B 19/14; H03H 9/00
[52] U.S. Cl. .................................. 331/107 A; 333/193
[58] Field of Search ................... 331/107 A, 182; 333/193

[56] References Cited

U.S. PATENT DOCUMENTS 3,921,093 11/1975 Lewis .................................. 331/1 A
3,936,765 2/1976 Lewis et al. ........................ 331/1 R

FOREIGN PATENT DOCUMENTS 448062 10/1972 Australia .
55-73105 6/1980 Japan .
55-51061 11/1980 Japan .
1446061 8/1976 United Kingdom ........... 331/107 A
1470055 4/1977 United Kingdom .

Primary Examiner—Eugene LaRoche
Assistant Examiner—G. Wan
Attorney, Agent, or Firm—Charles E. Pfund

[57] ABSTRACT

An surface acoustic wave coupling element is used having one output electrode (11d) and at least two input electrodes (11b, 11c) disposed at different distances or at different phase positions with respect to the output electrode, the input and output electrodes being arranged on one surface. The output electrodes of the element are connected to variable gain amplifiers through a power divider, the variable gain amplifiers receiving two gain control inputs. The output sides of these amplifiers (15, 16) are respectively connected to the input electrodes of said element. The variable frequency oscillator of this construction can be made much smaller than the prior art and can be effectively used as the high frequency oscillator in VHF and UHF bands.

21 Claims, 15 Drawing Figures

VARIABLE HIGH FREQUENCY OSCILLATOR

FIELD OF ART

This invention relates to a variable high frequency oscillator, and more particularly a variable frequency oscillator utilized for such frequencies as VHF band or UHF band utilized in mobile radio apparatus.

BACKGROUND OF THE INVENTION

Generally, such radio apparatus are used at frequencies higher than 100 MHz so that many frequency channels can be obtained and the apparatus can be miniaturized. For example a car telephone set mounted on a motor car has been operated an 800 MHz band. For the purpose of using at such high frequency an LC oscillator has mainly been used as a source of oscillation of a motor car telephone set.

This LC oscillator is constituted by connecting an inductance to be constituted by a microstrip line or a coaxial line and a voltage variable capacitance C such as a varactor diode so as to form an oscillation circuit. In such an LC oscillator, the dimension of the inductance L is determined by the operating frequency and since the varactor diode itself has a construction difficult to integrate there is a limit for miniaturization of the oscillator.

For example, according to a paper entitled "800 MHz VCO for Mobile Radio Synthesizer" of M. Makimoto, K. Nakabe and S. Nishiki in Electron Letter Vol. 15, No. 15, pages 460 and 461, published June 1979, the dimension of the oscillator is about 17 cm$^3$. For further miniaturizing such LC oscillator, one may consider to form the inductance L with a high dielectric material. However, the practical upper limit of the specific dielectric constant of the high dielectric material is about 40 so that at the frequency band of 800 MHz at which the car telephone set operates, $\lambda/4$ becomes about 1.5 cm so that when one considers the dimensions of an active circuit and the varactor diode, the dimension of the oscillator would be about 4 cm$^3$ so that it is difficult to miniaturize it beyond this size with an oscillator of this size, when one considers other paths constituting the car telephone set such oscillator is not suitable for use as the oscillator of such smaller radio apparatus as handy type apparatus.

We have noted an oscillator constituted by a surface acoustic wave coupling element acting as a delay line that is expectable to miniaturize and an amplifier. Such oscillator is disclosed in a paper entitled "Surface acoustic wave devices and applications 6. Oscillators" by M. F. Lewis, Ultrasonics, Pages 115-123, May 1974.

This oscillator utilizes a surface acoustic wave coupling element having two dephased outputs for one input, and the two outputs, are synthesized with a variable resistor and then inputted to an input of the amplifier, and is constructed such that the oscillation frequency is varied by changing the ratio of synthesis of said variable resistor. Although this oscillator utilizes the surface acoustic wave coupling element capable of miniaturizing the LC oscillator described above, since it utilizes a mechanical variable resistor there is a limit for the miniaturization thereof. Although a PIN diode may be substituted for the variable resistor the PIN diode is too difficult to integrate so that there is also a limit for the miniaturization. It was also considered to combine the surface acoustic wave coupling element with such external phase shifter as a CR phase shifter or an LC phase shifter, in order to provide a variable characteristic for the phase shifter, it is necessary to use aforementioned varactor diode that acts as a variable capacitance which presents a problem for integration. Furthermore, where the CR phase shifter is used insertion loss increases. Further, as the LC phase shifter utilizes an inductance L it is difficult to minaturize it in the same manner as the firstly described LC oscillator.

DISCLOSURE OF THE INVENTION

Accordingly, a principal object of this invention is to provide a variable high frequency oscillator having a smaller size than the prior art oscillator.

Another object of this invention is to provide a variable high frequency oscillator capable of oscillating stably over the entire operating bandwidth.

A further object of this invention is to provide a variable high frequency oscillator useful for a handy type radio apparatus.

To accomplish these object, according to this invention, at least two propagation paths having different propagation phases are provided for a surface acoustic wave coupling element by noting the fact that where two surface acoustic waves having different magnitudes are propagated through the surface acoustic wave coupling element a synthesized output having different phase characteristic from that of the input can be obtained on the output side so as to control the oscillation frequency characteristic by controlling the gain of an amplifier disposed on the input side of the surface acoustic wave elements.

Accordingly, according to one embodiment of this invention, there is provided a variable frequency oscillator characterized by comprising a power divider that divides an input signal into a plurality of signals, a plurality of variable gain amplifiers respectively amplifying the output signals of the power divider and provided with control terminals receiving gain control inputs, and a first surface acoustic wave coupling element having at least one interdigital output electrode disposed on one surface and a plurality of interdigital input electrodes arranged on the same surface and adapted to receive the output signals of said corresponding variable gain amplifiers, the output electrode of said surface acoustic wave coupling element being connected to the input side of said power divider to form a positive feedback loop.

BEST MODES OF CARRYING OUT THE EMBODIMENTS

Figure 1:
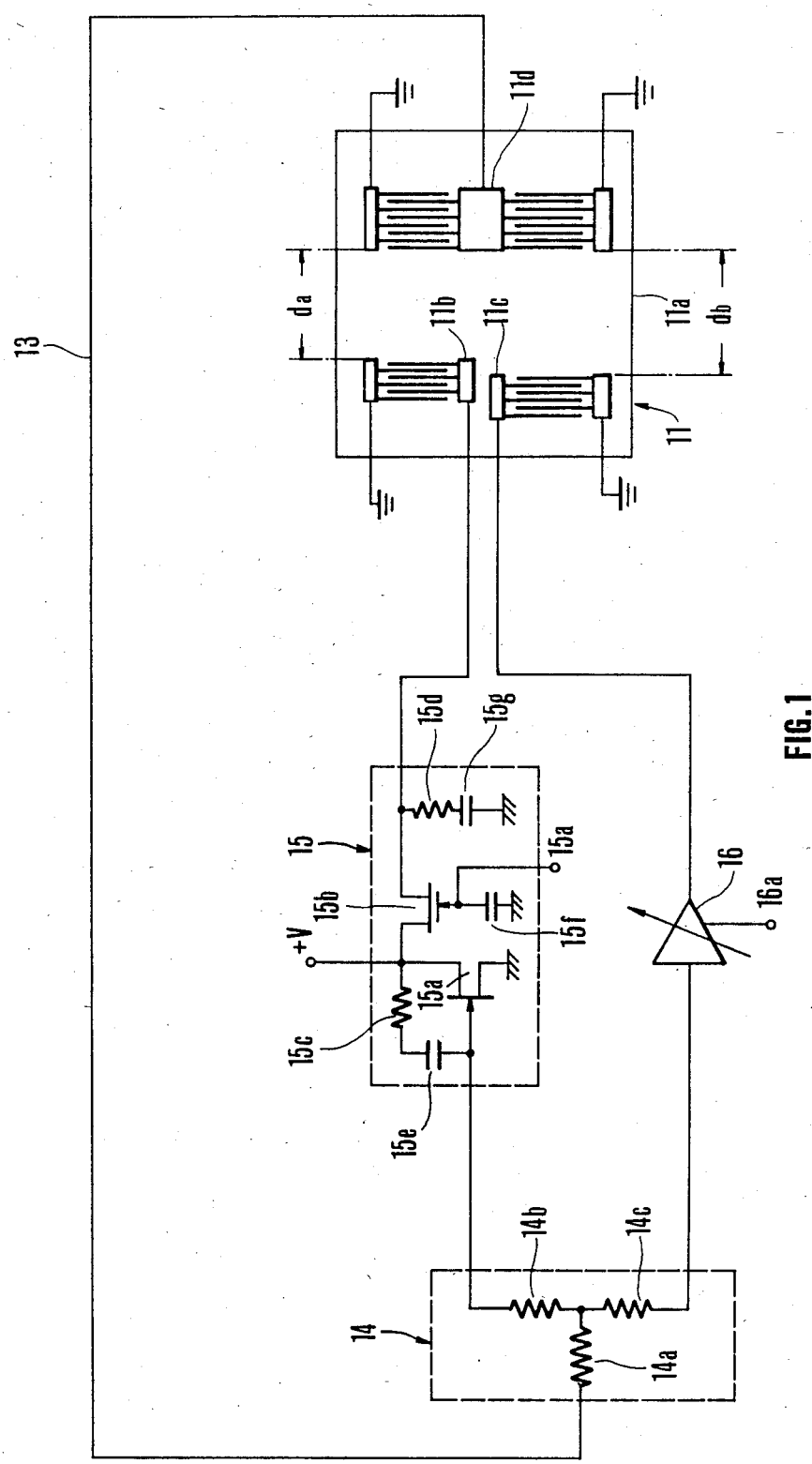
FIG. 1 is a connection diagram showing a first embodiment of the variable high frequency oscillator embodying the invention.

FIG. 1 shows one embodiment of the variable high frequency oscillator embodying the invention in which a surface acoustic wave coupling element 11 acting as a delay line is constituted by a rectangular surface acoustic wave coupling element main body 11a made of such piezoelectric substrate as $LiTaO_3$, $LiNbO_3$, $Bi_2GeO_{20}$, quartz, CdS and ZnO, two input electrodes 11b, 11c and one output electrode 11d which are disposed in parallel on one surface of the main body 11a. Each of these electrodes has a well known interdigital construction. Each of the input electrodes 11b and 11c comprises a set of interdigital opposing electrode structure, one electrode receiving an input while the other electrode being grounded. When an AC input is applied to one of these comb tooth electrodes a surface acoustic wave is generated by the electric field formed between opposing electrodes and the surface wave propagates in the direction of the output electrodes 11d. Thus, the output electrode 11d is disposed at different distances da and db from the input electrodes 11b and 11c in the direction of propagation of the surface waves from the input electrodes 11b and 11c.

In this example, the output electrode 11d is constituted by two sets of opposing electrodes of the interdigital construction. The outer electrodes are grounded whereas the inner electrodes are commonly connected to send out an output. This surface acoustic wave coupling element 11 constitutes an interdigital transducer. The number of comb teeth of the output electrode and respective input electrodes is suitably determined by taking into consideration the conversion efficiency of respective electrodes.

The output electrode 11d of the surface acoustic wave coupling element 11 is connected to a power amplifier 14 through a line 13 acting as a positive feedback loop of the oscillator. This power amplifier 14 is constituted by these resistors, for example, with their one ends commonly connected. One of the resistors 14a is connected to said positive feedback loop 13, whereas the resistors 14b and 14c are respectively connected to the input sides of variable gain amplifiers 15 and 16 to be described later in detail. The power divider 14 divides the output of the surface acoustic wave coupling element 11 sent through the positive feedback loop 13 into two portions of the same phase and sends the divided portions to variable gain amplifiers 15 and 16.

This variable gain amplifiers 15 and 16 have the same construction and are respectively provided with control terminals 15a and 16a supplied with gain control inputs from external circuits.

When supplied with gain control inputs, these variable gain amplifiers 15 and 16 changes their gains. The typical construction will be described with reference to the amplifier 15. This variable gain amplifier 15 is constituted by two field effect transistors (FET) 15a and 15b, resistors 15a and 15d and capacitors 15e, 15f and 15g. Consequently, the output of the power amplifier 14 supplied thereto is firstly amplified by FET 15a, and the magnitude of the output signal is controlled according to the magnitude of the control signal supplied to the gate electrode of FET 15b. The variable gain amplifier having such construction is well known in the art. One example of a prior publication is a paper entitled "GaAs IC wide bandwidth low noise amplifier whose gain is controllable" of Masahiro Nishijima et al, Technical Publication of Institute of Electronics and Communication Engineers of Japan, pages 23–28, published Jan. 1982.

The output of these variable gain amplifiers 15 and 16 are respectively supplied to two input electrodes 11b and 11c of the surface acoustic wave coupling element 11. The input electrodes 11b and 11c are respectively excited by the input voltage to generate surface acoustic waves which are synthesized by the output electrode 11d to be converted again into an electric output.

Figure 2A:
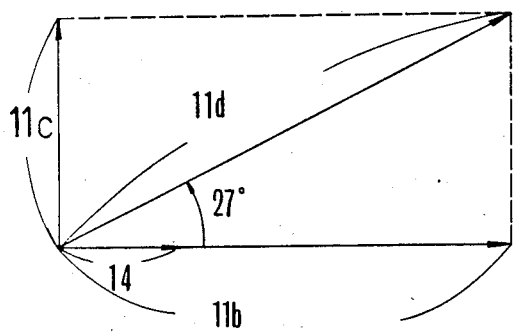
FIGS. 2(a) and 2(b) are graphs useful to explain the operation of the first embodiment shown in FIG. 1.
Figure 2B:
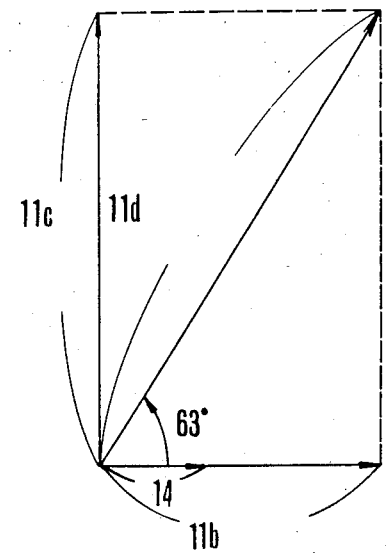

In the variable high frequency oscillator of the construction described above, since the distance between the input electrode 11b and the output electrode 11d in the direction of propagation of the surface acoustic wave (in the left and right direction in the drawing) is made different from the distance between the input electrode 11c and the output electrode 11d, when the surface acoustic waves connected by the input electrodes 11b and 11c arrive at the output electrode 11d, a fixed propagation phase difference is produced corresponding to the difference in the distances to respective input electrodes. Denoting the phase difference by $\alpha$ the phase of the electric signal synthesized by and outputted from the output electrode 11d can be varied as desired by varying the amplification factors of the variable gain amplifiers 15 and 16. In this embodiment, the phase difference $\alpha$ is set to 90°. Thus, the difference between the special electrode positions of the input electrtodes 11b and 11c is m $\lambda+\lambda/4$ ( $\lambda$ represents the wavelength of the surface acoustic wave at the operating center frequency, m=0, 1, 2, ... ).

Where the gain of the amplifier 15 is made to be 4 and that of the amplifier 16 is made to be 2 with reference to the output of the power amplifier 14, as shown in FIG. 2(a), since the output of the input electrode 11b becomes twice of the output of the input electrode 11c, the phase of the synthesized output from the output electrode 11d has changed by about 27° with respect to the input to the input electrode 11b. In the same manner, where the gain of the amplifier 15 is made to be 2 and that of the amplifier 16 is made to be 4, the synthesized output of the output electrode 11d has a phase difference of about 63° with reference to the input to the input electrode 11b as shown in FIG. 2(b). In this manner, by varying the amplification factors of the amplifiers 15 and 16 the phase of the synthesized output signal from the output electrode 11d can be varied as desired. Accordingly, by applying the output of the output electrode of the surface acoustic wave coupling element 11 to the input of the power divider 11 to form the positive feedback loop and by making the gain of this loop to be larger than 1, an oscillation occurs at a frequency at which the phase of the loop becomes $2n\pi$(n is an integer). Thus, by varying the gains of the amplifiers 15 and 16 it is possible to vary the oscillation frequency of the oscillator.

As above described, it is possible to obtain a variable high frequency oscillator having smaller size than the prior art oscillator by operating the surface acoustic wave coupling unit not only as a delay line but also as a fixed phase shifter by varying the distances between two input electrodes and the output electrode disposed on the surface of the element by varying the phase and further by varying the gain of the amplifier provided in the feedback loop for the purpose of varying the frequency.

One example of the dimensions of the surface acoustic coupling element of the embodiment shown in FIG. 1 is as follows:

the number of electrodes: 2 (one input electrode and one output electrode)

number of pairs of respective electrodes : 20 spacing between pairs (electrode end pitch) : 5 microns (corresponding to wavelength)

number of spacing : 3 (from the end edge to the input electrode; from input electrode to the output electrode, from input electrode to output electrode, and from output electrode to end edge).

The length of the element in the direction of propagation of the elastic length can be expressed as follows.

$$\text{length} = 2 \times 20 \times 5 + 3 \times 60 \times 5$$
$$= 1.1 \text{ mm}$$

Although the overlap width of the electrode can be suitably determined, the width is determined by the size of the actual taking out electrode pad, when it is assumed that the width is 2 mm, the dimension of the surface acoustic wave coupling element is of 1.1 mm length and 2 mm width. When the power amplifier 14 and two variable gain amplifiers 15 and 16 are fabricated into a single IC circuit with present day IC technique, the size of the IC circuit is about 3 mm$^2$.

Consequently, the overall dimension of the oscillator becomes 0.3–0.45 cm$^3$. It can be noted that it is possible to reduce the size of the oscillator to 1/10–1/15 of the prior art LC oscillator.

Figure 3:
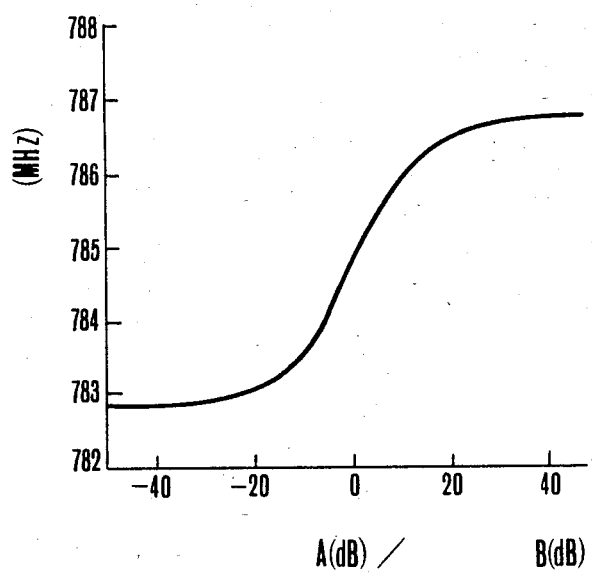
FIG. 3 is a characteristic curve showing the relation between the amplification factor ratio and the variation in the oscillation frequency of the embodiment shown in FIG. 1.

One example of relation between the frequency variation of the oscillator of this invention and the gain ratio A/B of the variable gain amplifiers 15 and 16 of the illustrated example is shown in FIG. 3, where gains A and B are represented by dB.

Figure 4:
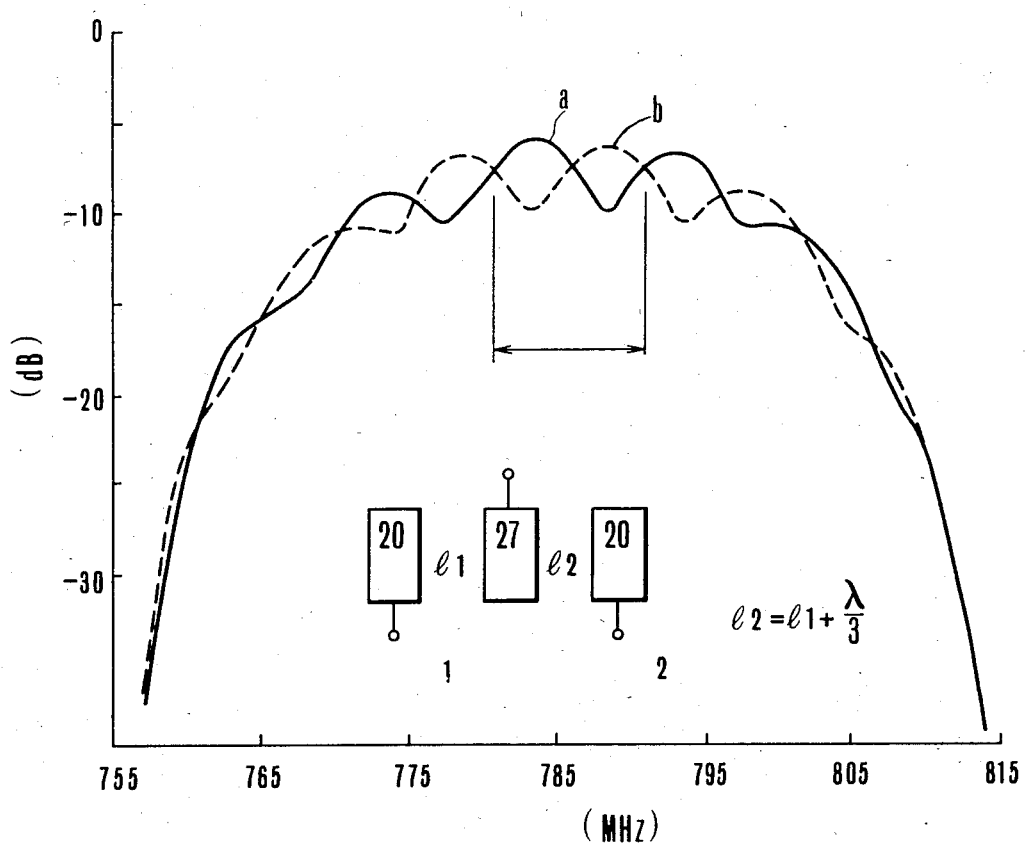
FIG. 4 shows characteristics of the embodiment shown in FIG. 1 wherein the frequency-loss characteristics were obtained by computer simulation.

FIG. 4 shows one example of the relation between the frequency and the loss of electric surface wave coupling element of the embodiment shown in FIG. 1, the relation being determined by computer simulation.

The calculation parameters utilized are as follows:

spacing between opposing electrodes: 0.2 mm number of pairs of the input electrodes : 20 number of pairs of the output electrodes : 27 electrode phase difference : $\lambda/3$ (120°)

material of the surface acoustic wave substrate : LiNbO$_3$

Characteristics a and b shown in FIG. 4 are the characteristics obtained when the same input is independently applied to the inputs 1 and 2. These characteristics show that a relatively low loss characteristic can be obtained in a frequency range of 795–806 MHz.

Figure 5:
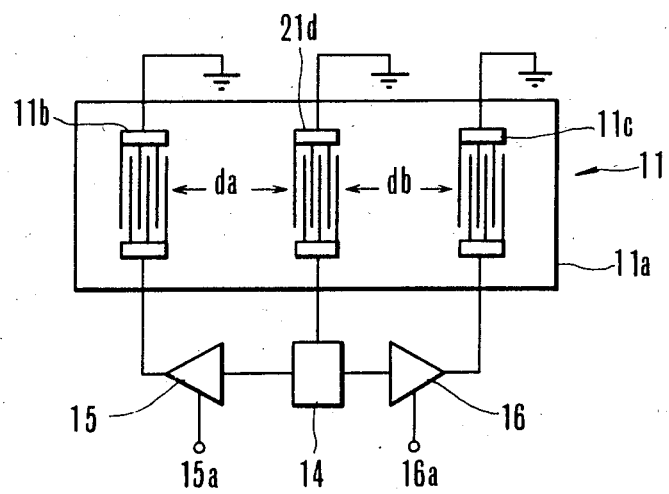
FIG. 5 is a connection diagram showing the second embodiment of the variable high frequency oscillator according to this invention.

FIG. 5 shows a second embodiment of this invention which is different from FIG. 1 in that aligned input electrodes 11b and 11c are disposed on both sides of a single output electrode 21d of the interdigital construction, on the main body 11a of the surface acoustic wave coupling element 11. In this case, the spacing da between the input electrode 11b and the output electrode 21d, and the spacing db between the input electrode 11c and the output electrodes 21d are made to be different in the same manner as in FIG. 1 so as to inherently provide a propagation phase difference in the surface acoustic wave propagating therebetween.

With this modification too, an oscillation can be produced in the same manner as in FIG. 1. This modification can simplify the construction than FIG. 1 so that it is possible to miniaturize the oscillator than in FIG. 1.

Figure 6:
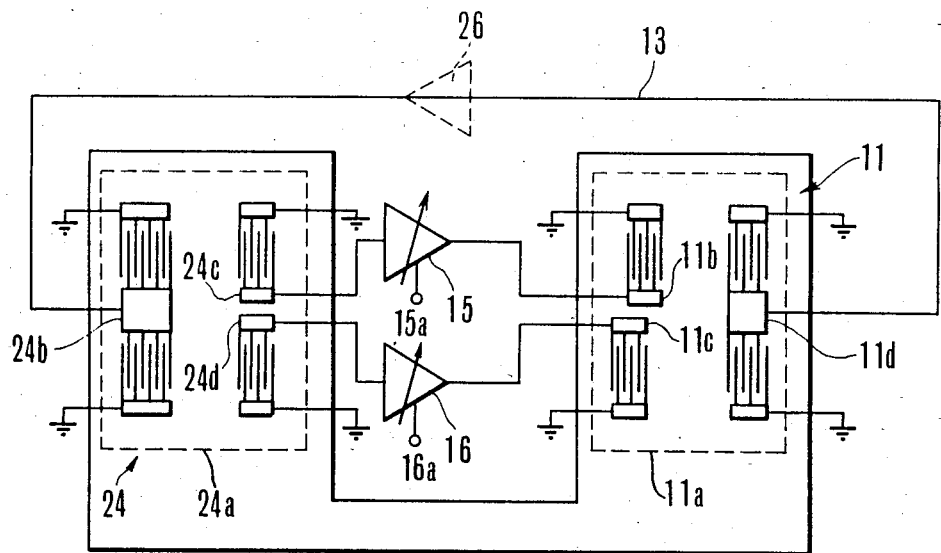
FIGS. 6 through 8 are connection diagrams showing third through fifth embodiments of the variable high frequency oscillator according to this invention.

FIG. 6 shows the third embodiment of this invention in which the power divider 14 shown in FIG. 1 is constituted by a surface acoustic wave element 24 which is mounted on the same surface acoustic wave substrate U on which the surface acoustic wave coupling element 11 is also mounted. The power divider 14 comprises an input electrode 24b constituted by two sets of pair electrodes and output electrodes 24c and 24d each parallely disposed on one surface of the element main body 24a. In this case, the spacings between the input electrode 24b and respective output electrodes 24c and 24d are the same as m$\lambda$, with the result that the output signals derived out from respective output electrodes 24c and 24d have the same phase so that these elements operate as a power divider.

The outputs from the output electrodes 24c and 24d are amplified by amplifiers 15 and 16 respectively and then inputted to respective input electrodes 11b and 11c of the surface acoustic wave coupling element 11 and the synthetic output of its output electrode 11d is positively fed back to the input electrode 24b of the power divider 24. In the same manner as in the first and second embodiments described above, the input electrodes 11b and 11c have positional difference of $\lambda/4$ in the direction of propagation of the surface wave.

Even with this construction it is possible to cause high frequency oscillation in the same manner as the embodiments described above. In this case, since the power divider 24 is mounted on the same substrate together with the surface acoustic wave coupling element acting as a delay line, it is more advantageous to miniaturize. In FIG. 6, for the purpose of compensating for the loop loss, an amplifier 26 may be inserted in the positive feedback loop 13 extending between the surface acoustic wave coupling element 11 and the power divider 24. It should be noted that such amplifier can also be inserted in the embodiments shown in FIGS. 1 and 5.

Figure 7:
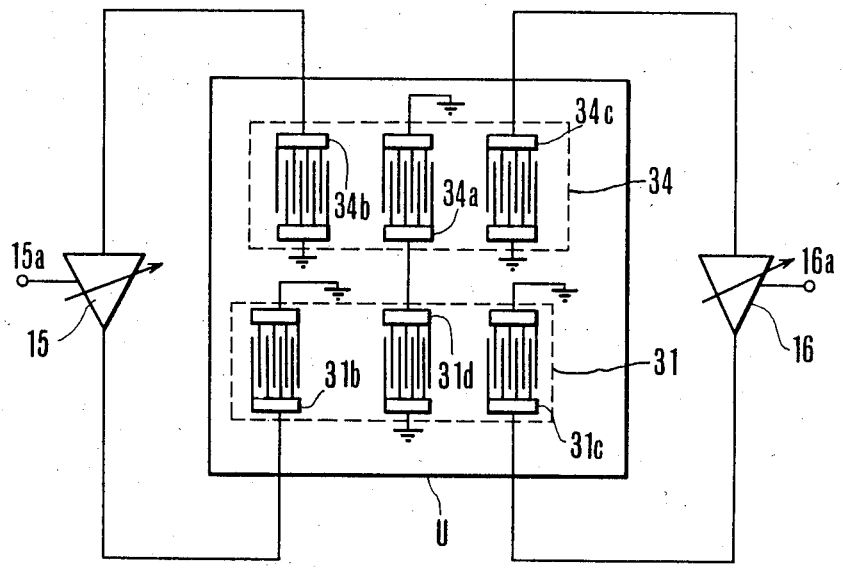

FIG. 7 shows the fourth embodiment of this invention. In this case two surface acoustic wave elements are formed on the same surface acoustic wave substrate U, one being used as a power divider 34 and the other as an surface acoustic wave coupling element 31. This is the same as the aforementioned third embodiment. However, this embodiment is characterized by the arrangement of the input electrode 34a and the output electrodes 34b and 34c that constitute the power divider 34, and by the electrode arrangement of the surface acoustic wave coupling element. Thus, the power divider 34 is directly connected to the output side of the surface acoustic wave coupling element 31, and the output electrodes 34b and 34c are formed at positions of the same phase (equidistance positions) on both sides of the input electrode 34a. Two input electrodes 31b and 31c of the surface acoustic wave coupling element are formed at different phase positions on both sides of the output electrode 31d, while the output of the output electrode 31d is directly connected to the surface acoustic wave substrate U common to the input electrode 34b of the power divider 34. According to this construction, the size of the input electrode 34a of the power divider and the output electrode 31d of the surface acoustic wave coupling unit can be made to be ½ of that of the third embodiment shown in FIG. 6. Thus, there is an advantage that they can be formed on a substrate of a very small area. Of course, the output electrodes 34b and 34c are connected to the input electrodes 31b and 31c respectively via variable gain amplifiers 15 and 16.

Figure 8:
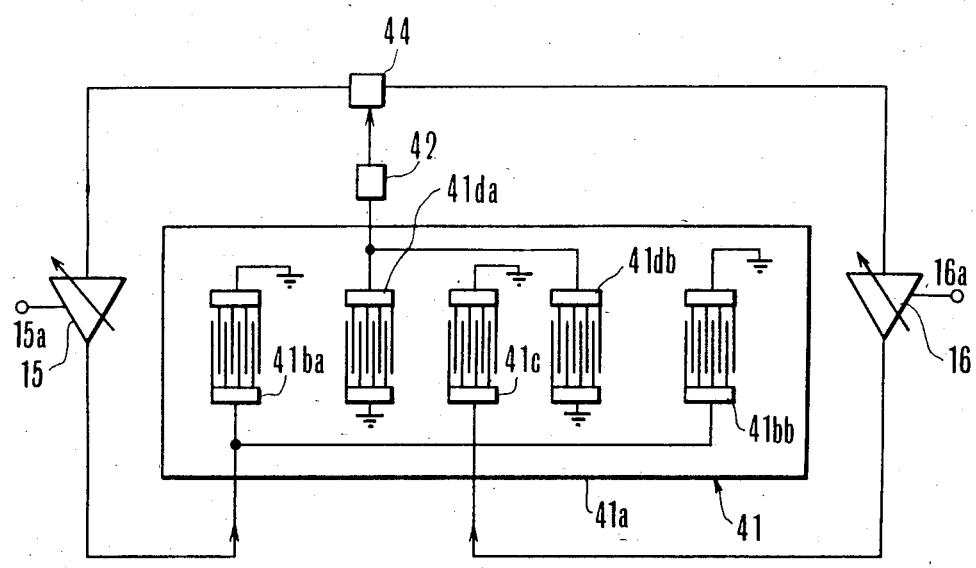

FIG. 8 shows the fifth embodiment of this invention. In this case, the surface acoustic wave coupling element has five interdigital electrode structure on the main body 41a of the element. One of the input electrodes is constituted by two input electrodes 41ba and 41bb on both sides and connected commonly and the remaining input electrodes 41c is disposed between the first and second input electrodes 41ba and 41bb. Also the output electrode is constituted by the commonly connected first and second output electrodes 41da and 41db. The first output electrode 41da is disposed between the first input electrode 41ba and the input electrode 41c while the second output electrode 41db is disposed between the input electrode 41c and the second input electrode 41bb, respectively with predetermined spacings with adjacent electrodes. More particularly, the spacings between the input electrodes 41ba and 41bb and between the output electrodes 41da and 41db are the same and the spacings between the input electrode 41c and the output electrodes 41da and 41db are also the same. However the spacings between the input electrode 41ba and the output electrode 41da and between the input electrodes 41c and the output electrode 41db are displaced by λ/4, for example, with reference to the propagated elastic wave. Furthermore, the commonly connected output electrodes 41da and 41db are connected to the power divider 44 via an amplitude limiter 42 and the signal divided by the power divider is sent to variable gain amplifiers 15 and 16, the outputs thereof being supplied to input electrodes 41ba, 41bb and 41c respectively.

This construction can improve the conversion efficiency of the surface acoustic wave coupling unit 41 than the foregoing embodiments. More particularly, when the output signal of the variable gain amplifier 16 is converted into surface acoustic wave by the input surface acoustic 41c, the elastic wave propagates to both sides of the electrodes 41c and received by the output electrodes 41da and 41db to be converted again into electric signals. As a consequence, the bidirectional loss of the surface acoustic wave is decreased thereby improving the conversion efficiency as above described. The output of the variable gain amplifier 15 is sent to two input electrodes 41ba and 41bb, and the elastic waves converted by these electrodes are received by the ouput electrodes 41da and 41db. In this embodiment, the reason that the amplitude limiter 42 is disposed between the output electrodes 41da and 41db and the power divider 44 is to prevent amplifier when an oscillation loop is formed, thus failing to obtain a variable gain characteristic.

Figure 9:
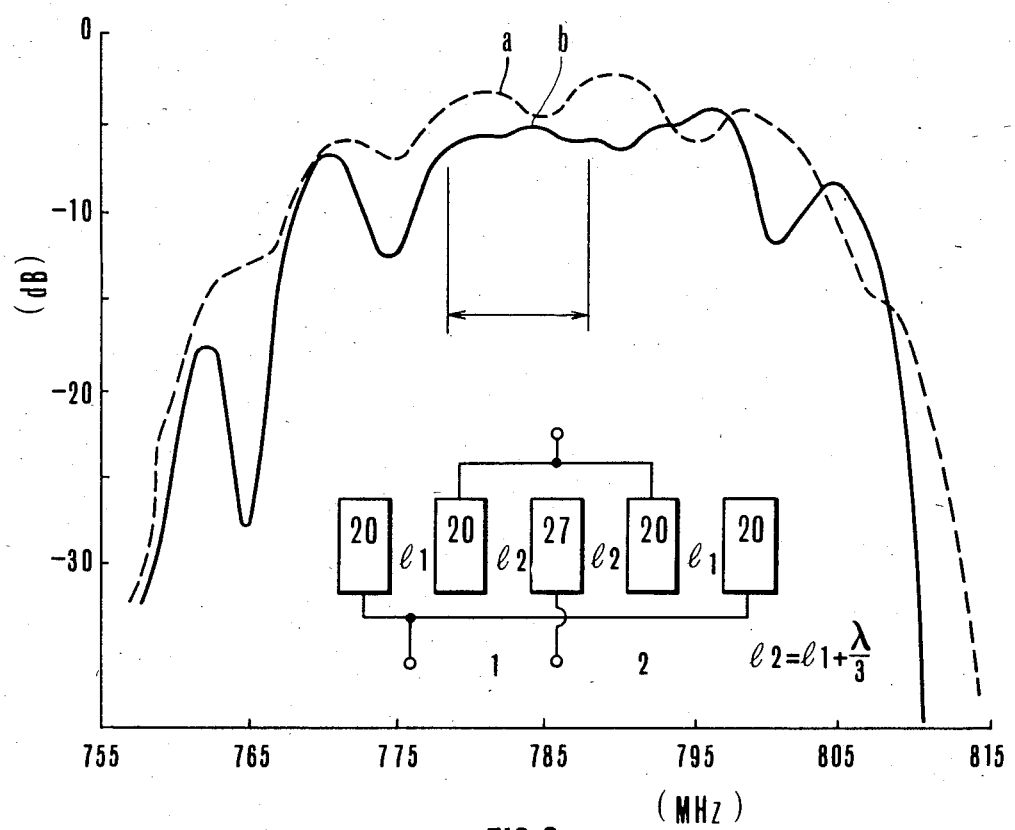
FIG. 9 are graphs showing the frequency-loss characteristics of the embodiment shown in FIG. 8, corresponding to that of the embodiment shown in FIG. 4.

Like FIG. 4, FIG. 9 shows the relationship between the frequency of the surface acoustic wave coupling element shown in FIG. 8 and the loss, this characteristic being obtained by computer simulation. The calculating parameters in this case are similar to FIG. 4 except that the numbers of the input and output electrodes are increased.

From the characteristic shown in FIG. 9 it can be understood that this embodiment has a smaller loss than the case shown in FIG. 4.

Figure 10:
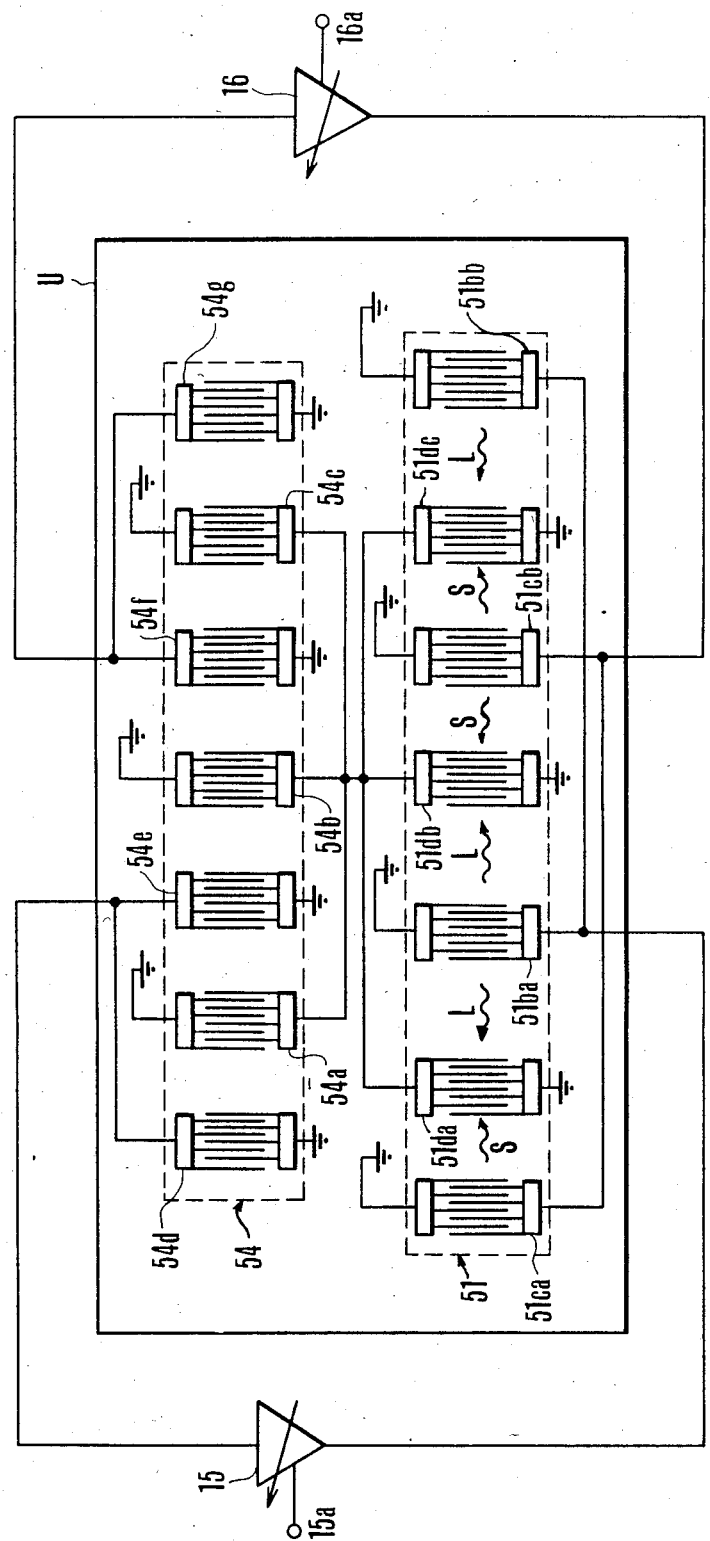
FIGS. 10 and 11 are connection diagrams showing still other embodiments of the variable high frequency oscillator according to this invention.

FIG. 10 shows the 6th embodiment of this invention which is identical to that shown in FIG. 4 in that the power divider 54 and the surface acoustic wave coupling element 51 are formed on the same surface acoustic wave substrate U. However, in this embodiment, the surface acoustic wave coupling element 51 has a plurality of output electrodes 51da, 51db and 51dc. The input electrodes 51ba and 51ca are disposed at different phase positions on both sides of the output electrode 51db, the output electrode 51da is disposed to the left of the input electrode 51ba and the output electrode 51dc is disposed to the right of the input electrode 51ca. Consequently, the surface acoustic wave produced by converting the output signal of the variable gain amplifier 15 with the input electrode 51ba propagates towards left and right and received by output electrodes 51db and 51da respectively to be converted again into electric signals and outputted. Thus, in the same manner as the embodiment shown in FIG. 6 there is an advantage that the bidirectional loss of the surface acoustic wave can be reduced. With regard to the surface acoustic wave from the input electrode 51ba too, since it is received by the output electrodes 51db and 51dc, the loss can be decreased. These plurality of output electrodes are commonly connected and then positively fed back to the input electrodes 54a, 54b and 54c of the power divider 54.

It is possible to dispose the input electrode 51ca of the surface acoustic wave coupling unit 51 to the left of the output electrode 51da and to dispose the input electrode 51bb to the right of the output electrode 51dc so as to connect them to the outputs of the variable gain amplifiers 16 and 15 respectively.

In this case, the output electrode 51dc synthesizes and outputs the different phase surface waves from input electrodes 51ba and 51ca. In the same manner, since the output electrode 51dc synthesizes and outputs different phase surface waves from the input electrodes 51cb and 51bb the synthesized output of the surface waves from three output electrodes 51da, 51db and 51dc becomes larger. In this manner, by alternately arranging a plurality of input electrodes and output electrodes the loss of the element becomes low, thereby decreasing the gain of the variable gain amplifier.

Figure 11:
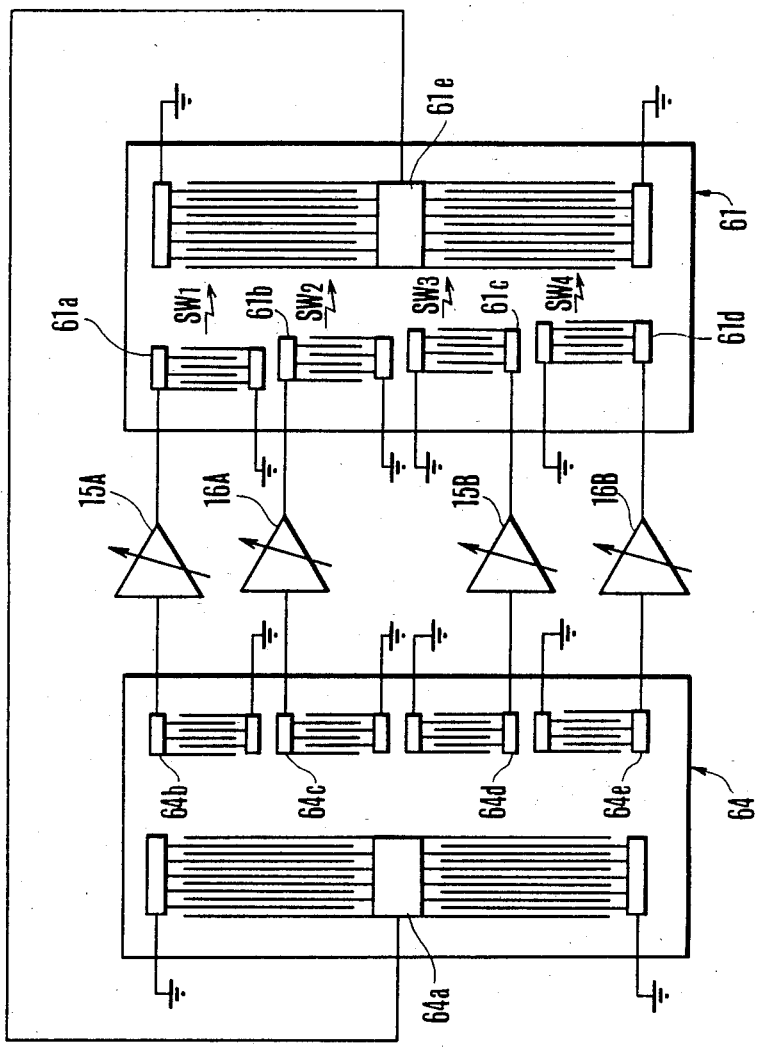
Figure 12:
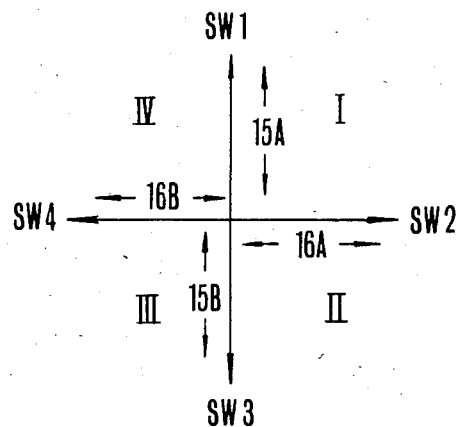
FIG. 12 is a graph useful to explain the operation of the embodiment shown in FIG. 11.

On both sides of the input electrodes 54b of the power divider 54 are disposed two output electrodes 54e and 54f but it is possible to provide an additional input electroe 54d to the left of the output electrode 54e, to form an input electrode 54c to the right of the output electrode 54f and to commonly connect the input electrodes 54a, 54b and 54c. It is also possible to provide output electrode 54d to the left of the input electrode 54a, to provide an output electrode 54g to the right of the input electrode 54c, to commonly connect the output electrodes 54e and 54d to the input of the variable gain amplifier 15 and to commonly connect the output electrodes 54f and 54g to the input of the variable gain amplifier 16. By alternately arranging a plurality of input electrodes and output electrodes at a definite spacing the propagation loss of the surface acoustic wave can be reduced. FIG. 11 shows the seventh embodiment of this invention. In this case, the power divider 64 is constituted by an elastic surface wave element 61 having one input electrode 64a and four output electrode 64b, 64c, 64d and 64e, the four output electrodes being connected to the inputs of variable gain amplifiers 15A, 16A, 15B and 16B respectively. The surface acoustic wave coupling element 61 has four input electrodes 61a, 61b, 61c and 61d and one output electrode 61e. The surface phase between respective four input electrodes 61a-61d and the output electrode 61c are different by 90° respectively. The outputs of the variable gain amplifiers 15A, 16A, 15B and 16B are inputted to input electrodes 61a, 61b, 61c and 61d respectively, while the output of the output electrode 61e is fed back to the input electrode 64a of the power divider 64. The surface wave SW1 converted by the input electrode 61a, the surface wave SW2 converted by the input electrode 61b, the surface wave SW3 converted by the input electrode 61c and the surface wave SW4 converted by the input electrode 61d, respectively utilizing the phase difference between the input electrode 61a and the output electrode 61e of the surface acoustic wave coupling element 61, as a reference, are dephased 90° respectively. Respective surface waves SW1-SW4 are represented by vectors having a difference of 90° as shown in FIG. 9. The magnitudes of the surface waves SW1-SW4 are determined by the gains of the variable gain amplifiers 15A, 16A, 15B and 16B are zero, for example, only the surface waves SW1 and SW2 are electrically converted and outputted by the output electrode 61e, so that in the same manner as has been described in connection with FIG. 2 it is possible to vary the oscillation frequency by varying the gains of the variable gain amplifiers 15A and 16A. The phase variation in this case is the variation in the first quadrant as shown in FIG. 12. Then, when it is assumed that the gains of the amplifiers 15A and 16B are zero, the phase can similarly varied in the second quadrant by varying the gains of the amplifiers 16A and 15B. In the same manner, when the gains of the amplifiers 15A and 16A are zero, the phase change is obtained in the third quadrant, whereas when the gains of the amplifiers 16A and 15B are zero, the phase variation is obtained in the fourth quadrant. Thus, by adjusting the gains of the variable gain amplifiers 15A, 16A, 15B and 16B, as it is possible to vary the oscillation frequency in the phase range of 360°, the range of variation of the oscillation frequency can be increased.

In this embodiment, an example of using four input electrodes having a phase difference of 90° is used, even with these input electrodes having a phase difference of 120°, for example, by adjusting the gains of these variable gain amplifiers connected to respective input electrodes, phase variation in a range of 360° can be obtained.

In this example, it is of course possible to form the surface acoustic wave coupling element 61 and the power divider 64 on the same substrate. It will be clear that the invention is not limited to the embodiments described hereinabove and that the invention involves various applications and modifications.

Figure 13:
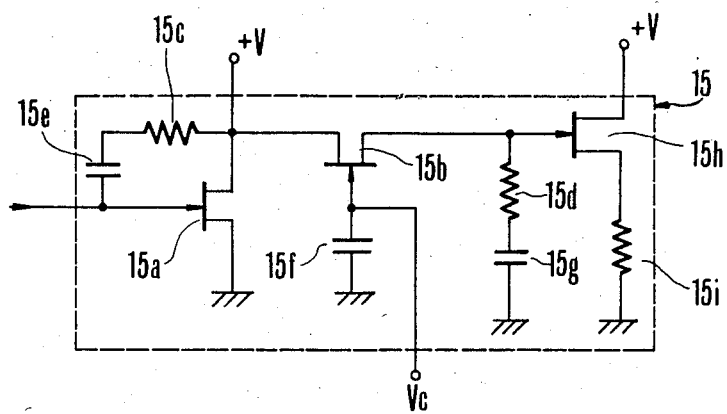
FIGS. 13 and 14 are connection diagrams showing other examples of the variable gain amplifier utilized in this invention.

For example, the concrete example of the variable gain amplifier was shown in FIG. 1, since the input impedance of the surface acoustic wave coupling element is relatively small, for the purpose of improving matching property, a buffer amplifier comprising a resistor 15i may be connected to FET 15h on the output stage of the amplifier, as shown in FIG. 13.

Figure 14:
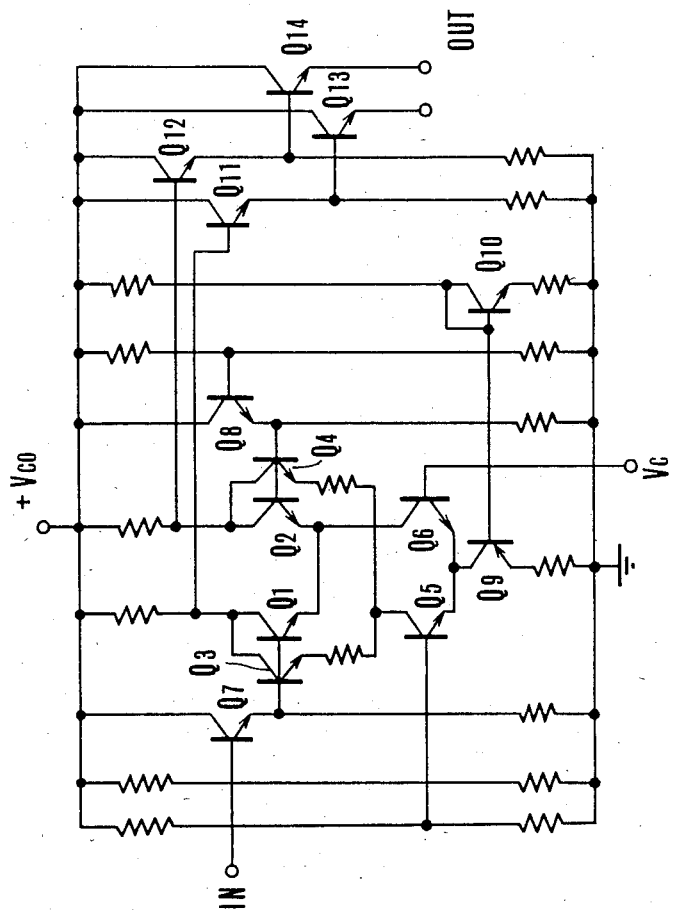

As shown in FIG. 14, the variable gain amplifier can be constituted by a differential amplifier constituted by a monolithic IC.

In FIG. 14, Q1-Q14 designate NPN transistors, R1-R17 resistors. Q1 and Q2, and Q5 and Q6 constitute first and second differential pairs, and the control input Vc supplied through a control input is supplied to the base of the transistor Q5 of the second differential pair. An input IN is supplied to the base of transistor Q1 of the first differential pair via transistor Q7, and the output of transistor Q1 is derived out as an output OUT via transistors Q11 and Q13, and Q12 and Q11. The detail of this variable gain amplifier circuit is published in a paper entitled "Monolithic IC ultra wide bandwidth amplifier" of Kamoto et al, Technical Publication of Institute of Electronics and Communication Engineers of Japan MW 81-104, published by the Institute of Electronic Society, Jan. 1982, page 75-80.

Although in FIG. 8, the amplitude limiter was provided between the surface acoustic wave coupling element and the power divider, the amplitude limiter can be placed at any position in the positive feedback loop. For example, it can be placed between the variable gain amplifier and the power amplifier or on the later stage of the variable gain amplifier.

Probability of the Industrial Application

As can be understood from the foregoing description of the embodiments, according to this invention, it is possible to vary the oscillation frequency by controlling the gain of the variable gain amplifier and since no variable resistor or the like is used it is possible to miniaturize the oscillator. Especially, this invention is effective where the oscillator is made of high density integrated circuit.

Furthermore, the phase difference between the plurality of input electrode and the output electrodes of the surface acoustic wave coupling element are stable because they are determined by the spacial arrangement.

Hence it is possible to stably control the oscillation frequency by merely varying the gain of the amplifier. Accordingly, it is possible to provide a variable frequency oscillator which is small, light weight and highly stable and can be integrated circuitized from VHF band to UHF band. Thus, the oscillator can be advantageously used as an oscillator of such mobile radio apparatus as a car telephone set or a portable telephone set.

What is claimed is:

1. A variable frequency oscillator. characterized by comprising a power divider which divides an input signal into a plurality of output signals, a plurality of variable gain amplifiers respectively amplifying the output signals of said power divider and having control terminals receiving gain control inputs, and a first surface acoustic wave coupling element having at least one interdigital output electrode arranged on one surface and a plurality of interdigital input electrodes disposed at positions spaced from said output electrode by different distances and supplied with corresponding output signals of said variable gain amplifiers, and said at least one output electrode of said surface acoustic wave coupling element being connected to the input side of said power divider so as to form a positive feed back circuit.

2. The variable high frequency oscillator as set forth in claim 1, characterized in that an amplifier is disposed in said positive feedback circuit.

3. The variable high frequency oscillator as set forth in claim 1, characterized in that an amplitude limiting circuit is disposed in said positive feedback circuit.

4. The variable high frequency oscillator as set forth in claim 1 wherein said surface acoustic wave coupling element is made of a material selected from piezoelectric substances including $LiTaO_2$ $LiNbO_3$, $Bi_2GeO_{20}$, quartz, CdS and ZnO.

5. The variable high frequency oscillator as set forth in claim 1, characterized in that said power divider is constituted by a second surface acoustic wave coupling element comprising at least one interdigital input electrode disposed on one surface and two interdigital output electrodes disposed at the same phase distance from said input electrode, and that said output electrodes of said second surface acoustic wave coupling element are respectively connected to corresponding variable gain amplifiers.

6. The variable gain high frequency oscillator as set forth in claim 5, characterized in that said first and second surface acoustic wave coupling elements are constituted by a single substrate.

7. The variable high frequency oscillator as set forth in claim 1, characterized in that said input electrodes and output electrodes of said first surface acoustic wave coupling element are aligned in one direction, and that said output electrodes are positioned between two input electrodes.

8. The variable high frequency oscillator as set forth in claim 7, characterized in that said power divider is constituted by one input electrode and two output electrodes on both sides of said input electrode on the substrate on which said first sarface acoustic wave coupling element is formed and at the same phase positions, said input and output electrodes being aligned in a direction parallel to the direction of the electrodes of said first surface acoustic wave coupling element, that the output electrode of the first surface acoustic wave coupling element and the input electrode of the power divider are directly connected together, and that the respective output electrodes of the power divider are connected to corresponding variable gain amplifiers.

9. The variable high frequency oscillator as set forth in claim 1 characterized in that the output electrode and one input electrode of said first surface acoustic wave coupling element comprise at least two output electrode portions and an input electrode portion which are commonly connected, that one of the output electrode portions is disposed between one input electrode portion and another one input electrode, and that the remaining output electrode portion and the remaining input electrode portion are disposed on one side of another input electrode at a predetermined spacing and in an order just mentioned.

10. The variable high frequency oscillator as set forth in claim 1 characterized in that the output electrode of said first surface acoustic wave coupling element comprises 3 output electrode portions, that said two input electrodes respectively comprise two input electrode portions, and that respective input electrode portions are aligned such that input electrode portions of different input electrodes are positioned with a predetermined spacing with respect to each of 3 output electrodes aligned with a suitable spacing.

11. The variable high frequency amplifier as set forth in claim 1 characterized in that said surface acoustic wave coupling element includes two additional input electrodes, that said power divider includes two additional output electrodes, that corresponding variable gain amplifiers are disposed between these electrodes, that respective output electrodes of the power divider are disposed at the same positions with respect to the input electrodes thereof, and that said surface acoustic wave coupling elements are disposed such that they will have different phases with respect to their output electrodes.

12. A variable frequency oscillator, characterized by comprising a power divider which divides an input signal into a plurality of output signals, a plurality of variable gain amplifiers respectively amplifying the output signals of said power divider and having control terminals receiving gain control inputs, and a first surface acoustic wave coupling element formed on a substrate, and first surface acoustic wave coupling element having at least one interdigital output electrode arranged on one surface of said substrate and a plurality of interdigital input electrodes disposed at positions spaced from said output electrode by different distances and supplied with corresponding output signals of said variable gain amplifiers, said at least one output electrode of said surface acoustic wave coupling element being connected to the input side of said power divider so as to form a positive feed back circuit, said power divider being constituted by one input electrode and two output electrodes on both sides of said input electrode on the substrate on which said first surface acoustic wave coupling element is formed and at the same phase positions, said input and output electrodes of said power divider being aligned in a direction parallel to the direction of the electrodes of said first surface acoustic wave coupling element, said at least one output electrode of the first surface acoustic wave coupling element and the input electrode of the power divider being directly connected together, and the respective output electrodes of the power divider being connected to corresponding variable gain amplifiers.

13. The variable high frequency oscillator as set forth in claim 12, characterized in that an amplifier is disposed in said positive feedback loop.

14. The variable high frequency oscillator as set forth in claim 12, characterized in that an amplitude limiting circuit is disposed in said positive feedback loop.

15. The variable high frequency oscillator as set forth in claim 12 wherein said surface acoustic wave coupling element in made of material selected from piezolectric substances including $LiTaO_2$, $LiNbO_3$, $Bi_2GeO_{20}$, quartz, CdS and ZnO.

16. The variable high frequency oscillator as set forth in claim 12, characterized in that said power divider is constituted by a second surface acoustic wave coupling element comprising at least one interdigital input electrode disposed on one surface and two interdigital output electrode disposed at the same distance from said input electrode, and that the output electrode of said second surface acoustic wave coupling element are respectively connected to corresponding variable gain amplifiers.

17. The variable gain high frequency oscillator as set forth in claim 16, characterized in that said first and second surface acoustic wave coupling elements are constituted by a single substrate.

18. The variable high frequency oscillator as set forth in claim 12, characterized in that said input electrodes and output electrodes of said first surface acoustic wave coupling element are aligned in one direction, and that said output electrodes are positioned between two input electrodes.

19. The variable high frequency oscillator as set forth in claim 12, characterized in that the output electrode and one input electrode of said first surface acoustic wave coupling element comprise at least two output electrode portions and an input electrode portion which are commonly connected, that one of the output electrode portions is disposed between one input electrode portion and another one input electrode, and that the remaining output electrode portion and the remaining input electrode portion are disposed on one side of another input electrode at a predetermined spacing and in an order just mentioned.

20. The variable high frequency oscillator as set forth in claim 12, characterized in that the output electrode of said first surface acoustic wave coupling element comprises three output electrode portions, that said two input electrodes respectively comprises two input electrode portions, and that respective input electrode portions are aligned such that input electrode portions of different input electrodes are positioned with a predetermined spacing with respect to each of three output electrodes aligned with a suitable spacing.

21. The variable high frequency amplifier as set forth in claim 12, characterized in that said surface acoustic wave coupling element includes two additional input electrodes, that said power divider includes two additional output electrodes, that corresponding variable gain amplifiers are disposed between these electrodes, that respective output electrodes of the power divider are disposed at the same positions with respect to the input electrodes thereof, and that said surface acoustic wave coupling elements are disposed such that they will have different phases with respect to their output electrodes.

* * * * *